United States Patent
Hack et al.

(10) Patent No.: US 9,390,649 B2
(45) Date of Patent: Jul. 12, 2016

(54) RUGGEDIZED WEARABLE DISPLAY

(71) Applicant: Universal Display Corporation, Ewing, NJ (US)

(72) Inventors: Michael Hack, Princeton, NJ (US); Ruiqing Ma, Morristown, NJ (US); Emory Krall, Philadelphia, PA (US)

(73) Assignee: Universal Display Corporation, Ewing, NJ (US)

(*) Notice: Subject to any disclaimer, the term of this patent is extended or adjusted under 35 U.S.C. 154(b) by 175 days.

(21) Appl. No.: 14/177,394

(22) Filed: Feb. 11, 2014

(65) Prior Publication Data

US 2015/0145839 A1    May 28, 2015

Related U.S. Application Data (60) Provisional application No. 61/909,433, filed on Nov. 27, 2013.

(51) Int. Cl.
  *G09G 3/32* (2016.01)
  *G09G 5/02* (2006.01)

(52) U.S. Cl.
  CPC ............ *G09G 3/3208* (2013.01); *G09G 5/024* (2013.01); *G09G 2320/0626* (2013.01); *G09G 2320/0686* (2013.01); *G09G 2320/08* (2013.01); *G09G 2330/021* (2013.01); *G09G 2360/144* (2013.01); *G09G 2380/02* (2013.01); *H01L 2251/5338* (2013.01)

(58) Field of Classification Search
  CPC combination set(s) only.
  See application file for complete search history.

(56) References Cited

U.S. PATENT DOCUMENTS

| | | | |
|---|---|---|---|
| 4,769,292 A | 9/1988 | Tang et al. | |
| 4,839,562 A * | 6/1989 | Francis | H05B 37/0281 315/129 |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,835,083 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Van Chow
(74) *Attorney, Agent, or Firm* — Morris & Kamlay LLP (57) ABSTRACT

A wearable, ruggedized device incorporating an OLED display is provided. The device is capable of operating in multiple modes, such as a lower-brightness and/or higher-contrast mode. The use of multiple modes allows for reduced power requirements, while providing responsiveness and continuous availability of the device to a user.

19 Claims, 4 Drawing Sheets

(56) References Cited

U.S. PATENT DOCUMENTS

| | | | |
|---|---|---|---|
| 6,468,819 B1 | 10/2002 | Kim et al. | |
| 6,532,152 B1 | 3/2003 | White et al. | |
| 6,734,845 B1 | 5/2004 | Nielsen et al. | |
| 6,822,683 B1 * | 11/2004 | Torikai | H04N 1/00352 348/207.99 |
| 7,279,704 B2 | 10/2007 | Walters et al. | |
| 7,431,968 B1 | 10/2008 | Shtein et al. | |
| 7,751,285 B1 | 7/2010 | Cain | |
| 7,844,310 B2 | 11/2010 | Anderson | |
| 7,968,146 B2 | 6/2011 | Wagner et al. | |
| 8,164,886 B1 | 4/2012 | Shelander et al. | |
| 2001/0004190 A1 | 6/2001 | Nishi et al. | |
| 2002/0084746 A1 | 7/2002 | Anzai | |
| 2003/0170491 A1 | 9/2003 | Liao et al. | |
| 2003/0230980 A1 | 12/2003 | Forrest et al. | |
| 2004/0174116 A1 | 9/2004 | Lu et al. | |
| 2004/0175020 A1 | 9/2004 | Bradski et al. | |
| 2005/0093433 A1 | 5/2005 | Ko | |
| 2005/0199783 A1 | 9/2005 | Wenstrand et al. | |
| 2007/0273281 A1 | 11/2007 | Biebel | |
| 2008/0111833 A1 | 5/2008 | Thorn et al. | |
| 2009/0026943 A1 | 1/2009 | Yuki | |
| 2010/0079508 A1 | 4/2010 | Hodge et al. | |
| 2010/0259159 A1 | 10/2010 | Seaman | |
| 2011/0248626 A1 | 10/2011 | Matsudate et al. | |
| 2012/0056169 A1 | 3/2012 | Kaiser et al. | |
| 2012/0286305 A1 | 11/2012 | Sasaki et al. | |
| 2013/0020933 A1 | 1/2013 | Levermore et al. | |
| 2013/0022227 A1 | 1/2013 | Wu et al. | |
| 2013/0082910 A1 * | 4/2013 | Lee | G09G 3/3208 345/76 |
| 2013/0111579 A1 * | 5/2013 | Newman | G06F 3/0488 726/17 |
| 2013/0113843 A1 | 5/2013 | Yamazaki | |

OTHER PUBLICATIONS

Baldo et al.,"Very high-efficiency green organic light-emitting devices based on electrophosphorescence", Applied Physics Letter, vol. 75, No. 1, pp. 4-6, 1999.

General Dynamics,"GD300 User Guide", General Dynamics Itronix 72-0141-001, 2014.

General Dynamics,"General Dynamics Itronix GD300", available at http://www.gd-itronix.com/index.cfm?page=Products:gd300, Feb. 3, 2014.

Ma et al.,"Wearable 4-inch QVGA Full Color Video Flexible AMOLEDs for Rugged Applications", Society for Information Display Digest, Paper 10.1, 2009.

Pebble,"Get Pebble", http://getpebble.com, 2013.

Pebble,"Pebble SDK: Using the Pebble Accelerometer", https://developer.getpebble.com/2/guides/accelerometer.html, 2013.

Pocketnow,"Motorola patents multi-display, eye-tracking smartwatch", http://pocketnow.com/2013108/30/motorola-smartwatch, Aug. 30, 2013.

Set Pebble,"Control Your Pebble Watch: Upright", http://setpebble.com/info?app=25, Dec. 27, 2013.

SmallFormFactors.com,"Leveraging the benefits of small form factor boards for military wearable computers", http://smallformfactors.com/articles/leveraging-benefits-small-boards-military-wearable-computers, Sep. 15, 2011.

* cited by examiner

RUGGEDIZED WEARABLE DISPLAY

PRIORITY

This application claims priority to U.S. Provisional Application No. 61/909,433, filed Nov. 27, 2013, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to wearable devices that incorporate OLEDs.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A wearable computing device is provided that includes an organic light emitting device (OLED) curved to a radius of curvature of not more than 20-100 cm and a display controller configured to operate the OLED in a first mode and in a second mode, where the controller selectively changes the brightness of a first region of an emission spectrum of the OLED in the first mode relative to the second mode by a first relative amount, and changes the brightness of at least a second region of the emission spectrum of the OLED in the second mode relative to the first mode by a second relative amount different than the first relative amount.

In an embodiment, the device may include various sensors such as an ambient light sensor configured to detect a brightness level of ambient light. The OLED may operate in the first mode when the brightness level of ambient light is below a first threshold, and in the second mode when the brightness level of ambient light is above a first threshold. The sensor may include an orientation sensor configured to detect a physical orientation of the device. The OLED may be operated in the first mode when the device is in a vertical orientation, and in the second mode when the device is in a horizontal orientation.

In an embodiment, the device may be ruggedized, and may be operable in water at a depth of at least 1 m. It may be operable at a luminance value of at least 700 cd/m² without exceeding an operating temperature increase of 26 C.

In an embodiment, a wearable computing device includes an organic light emitting device (OLED) curved to a radius of curvature not more than 20-100 cm and a ruggedization layer curved to a radius of curvature of not more than 20-100 cm. The device may be operable while immersed in water at a depth of at least 1 m.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
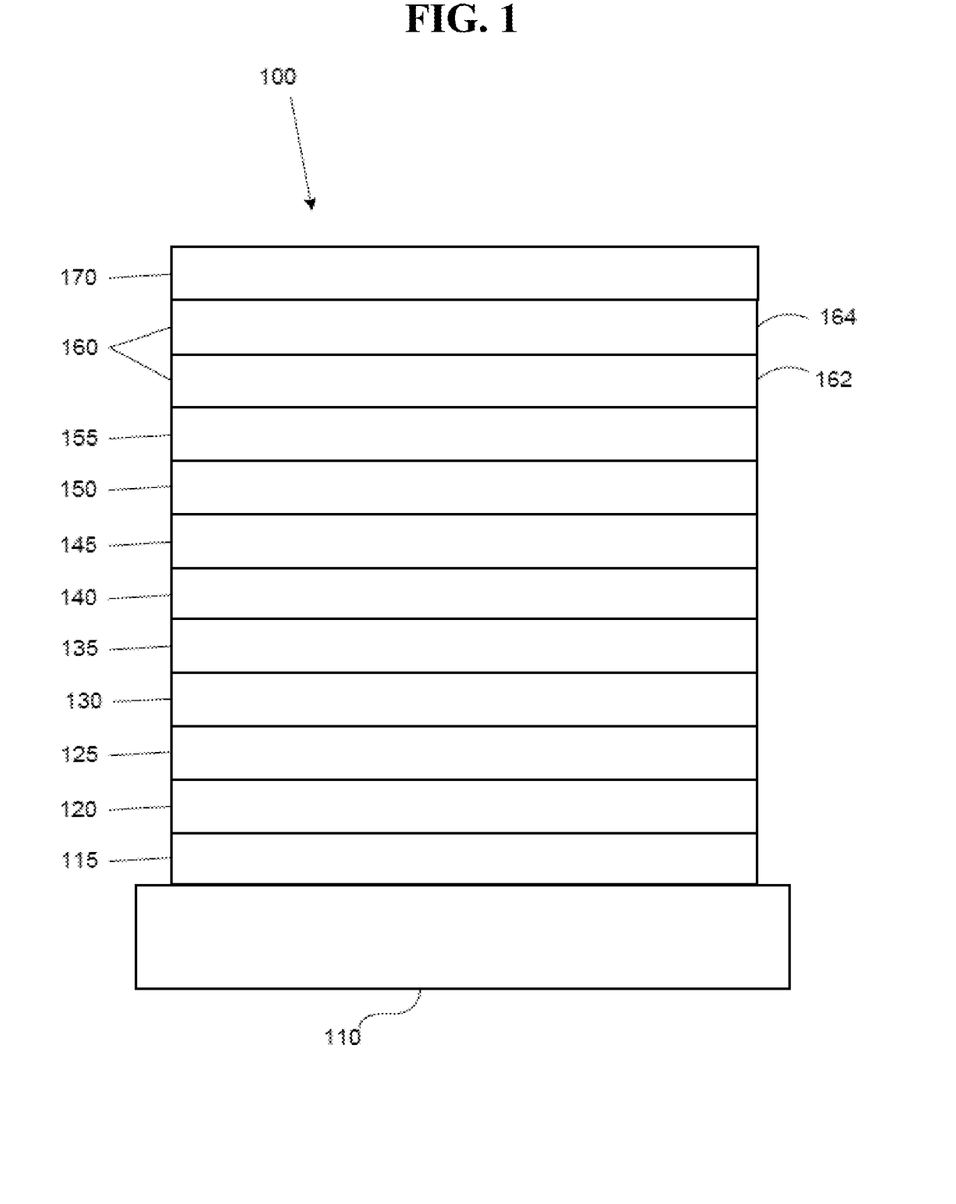
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
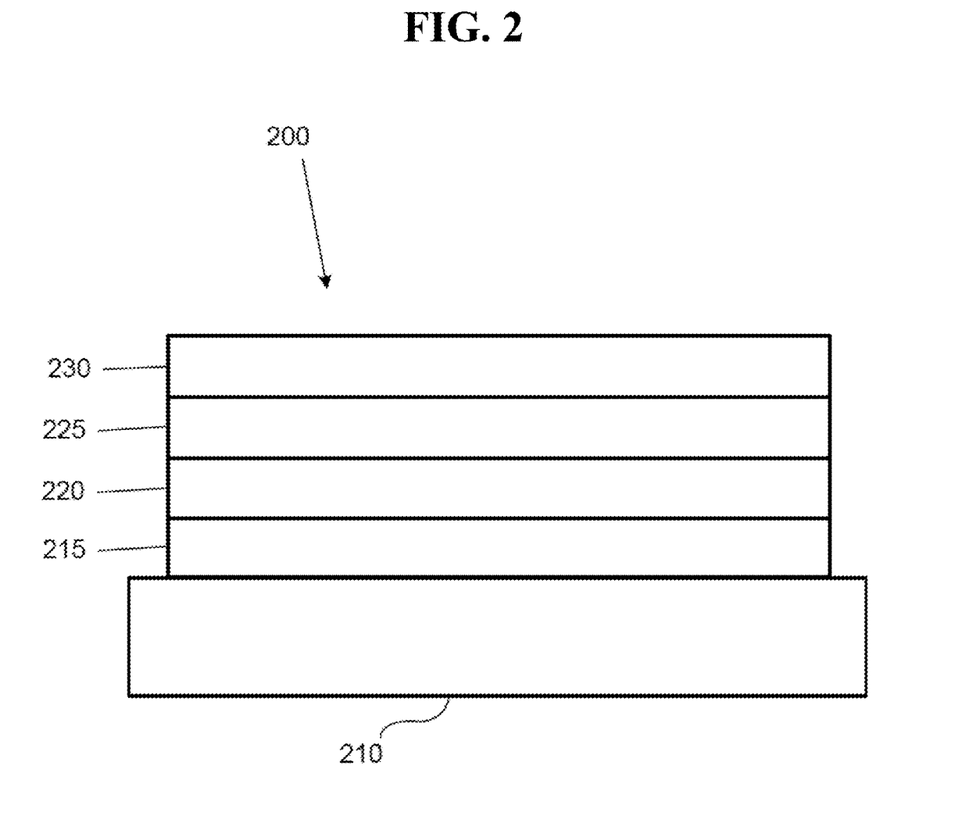
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, wearable displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

OLED displays may be used in a variety of devices, configurations, and environments, and may offer significant advantages over similar devices based on other display technologies, such as LCDs. For example, wearable OLED displays may be different from current LCD counterparts because OLED displays can be fabricated and/or disposed on flexible substrates, resulting in a wider variety of possible form factors.

In addition to being wearable, it may be desirable for portable devices to be ruggedized. Ruggedization is common for military and other devices, such as described in the U.S. Army standard MIL-STD-810G. There are many sources of ruggedized wearable displays, typically including LCD displays, such as the General Dynamics Itronix GD300. Many other devices are available in a ruggedized form factor, including devices from the sources listed in priority U.S. Application No. 61/909,433, filed Nov. 27, 2013, the disclosure of which is incorporated by reference in its entirety. However, there are no known OLED displays with curved or conformal displays in a ruggedized package.

One challenge with portable, wearable, and/or ruggedized displays is to provide sufficient power for the device to be usable for extended periods and to provide sufficient brightness to be daylight-readable, while maintaining a relatively small form factor. For example, the use of larger batteries to provide additional power may be undesirable for a device intended to be worn on the wrist, due to the additional weight and heat created by the batteries.

Embodiments of the present invention provide useful wearable displays of sufficient size and resolution to provide useful information in a convenient form factor and weight, while being ruggedized and shaped so as to be easily worn. Various embodiments include a rugged wearable OLED display and a computer in a communication system. A portable device as disclosed herein can, for example, provide the user with real time information, touch input and other functionality and communications as found in common cell phones, but in a ruggedized package in which the display may be is a flexible and/or curved OLED. For example, the display and/or the entire device may be conformed to fit around an arm or leg, or to otherwise fit comfortably against a wearer's body. In some configurations, the device may be used in a format that has much less curvature or that is relatively flat, such as when worn on the chest of a user. Thus, some configurations may have displays or devices that have a maximum radius of curvature of not more than 20 cm, 30 cm, 40 cm, 50 cm, 60 cm, 70 cm, 80 cm, or 100 cm.

The issues surrounding the power, heat, and size requirements of a wearable device may be particularly pronounced in the case of a ruggedized device. Additionally it may be advantageous for these displays to be readable in sunlight, and such devices typically require relatively high brightness in a ruggedized form factor. Unlimited power for higher-brightness displays typically cannot be supplied due to the problems arising from larger power supplies as described above. Further, heat dissipation may be more difficult to control in a rugged package with high power dissipation, so there may be a need to decrease the power supplied to the display at high brightness for daylight readability.

Figure 3:
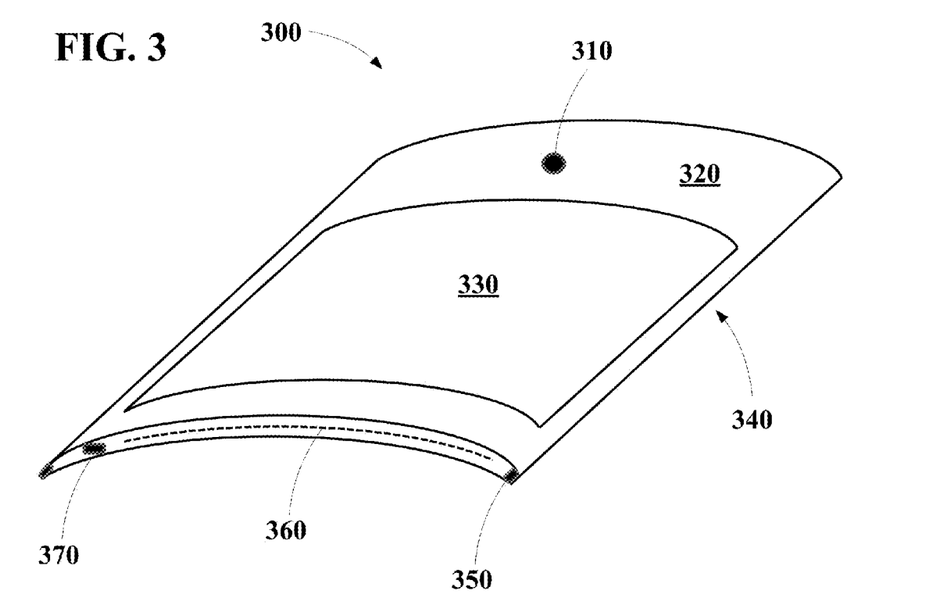
FIG. 3 shows an example wearable device according to an embodiment of the present invention.

FIG. 3 shows a schematic drawing of an example device according to an embodiment of the invention. The device 300 may have a radius of curvature of not more than about 20-100 cm. It may include an OLED display 360 disposed within the device, which may be covered by a transparent cover 330 and enclosed within a ruggedized case 340. One or more connectors 350, 370 may be disposed on an outer edge or elsewhere on the device, such as to allow connection of communication, power, or other connectors. The device may include one or more sensors 310 such as a camera, motion sensor, and the like, as disclosed herein. A portion 320 of the interior of the case 340 may be used for driving electronics, processors, and other components. In some configurations, the OLED 360 and cover 330 may be disposed over such electronics, to provide a larger viewing area.

Embodiments of the present invention may provide sufficient power by using multiple modes of operation. Generally, one mode of operation may be used when a high-brightness display is required, and/or when the device is in "active" use by a user, such as when the user is accessing information on the device, providing input to the device, or the like. In contrast, a second mode of operation may be used when the device is not in active use, such as when it is being worn by a user and may be operable to receive information, alerts, or the like, but is not being directly viewed or manipulated by the user. Alternatively or in addition, one mode of operation may be used when the device determines that a relatively high brightness is required for the display to be easily readable by a user, and another mode may be used when a lower brightness is sufficient.

For example, in normal brightness use, such as at 500 nits or less, the display may be operated in a first mode, which may be a relatively low-power mode. When a higher brightness is needed, such as because the ambient light level is higher, the device may enter a high-brightness mode that operates at, for example, 500 nits or more. As a specific example, it is generally accepted that in an environment with relatively bright sunlight, contrast is more important than color reproduction for display readability. Thus, when the device enters a high-brightness mode due to a higher ambient light level, the brightness of colors in the region of maximum sensitivity of the human eye may be increased to provide increased contrast with little or no increase in the power required by the display. More specifically, the brightness of the display in or near the green region of the visible spectrum may be increased relative to other regions of the visible spectrum. The ambient light level may be set by a user, or may be detected by a sensor such as a light sensor incorporated into the device. By adjusting the color balance in a high-brightness environment, devices as disclosed herein may provide improved lifetime and/or lower maximum power requirements. The lifetime of the OLED display also may be extended, since the level and amount of current provided to other components, such as blue-emitting components of the OLED, may be limited in high brightness applications.

Conventional LCD displays typically cannot adjust the brightness of different colors of a display unless a color-tunable backlight is used, which significantly increases the cost and complexity of the LCD display. Thus, OLED displays may be preferred for the various devices disclosed herein.

More generally, embodiments of the present invention provide devices capable of operating in two modes, one of which may be a lower-power and/or lower-brightness mode relative to the other. Such a device may include one or more sensors, which allow the device to change between modes based upon ambient brightness, orientation, movement, use by a user of the device, or the like.

In an embodiment, a device as disclosed herein may include an OLED and a display controller configured to operate the OLED in two modes. In one of the modes, the OLED may have a brightness in a first region of the visible spectrum that is different than the brightness of that region in the other mode. As a specific example, the OLED may be operated to have a higher brightness in the green region of the spectrum in one mode compared to another. The display controller may be configured to operate the OLED in one of the two modes, such as by changing the brightness of the OLED in the selected part of the emitted spectrum when operating in one of the modes by an amount relative to the brightness at which it operates in the other mode.

In an embodiment, the device may include a sensor that obtains data about ambient conditions, the state, status, orientation, or other arrangement of the device, or the like. For example, a light sensor may measure the brightness of ambient light and provide this data to a display controller on the device directly, or indirectly via a processor in the device. The display controller may then operate the OLED in either of the two modes based upon the level of ambient light. For example, the OLED may be operated in a lower-brightness mode when the ambient light measured by the light sensor is below a threshold, and in a higher-brightness mode when the ambient light is measured at above the threshold. The higher- and lower-brightness modes may correspond to any relative brightness at which the OLED is capable of operating, including fully on and fully off. In addition, a lower-power or lower-brightness mode may include other operating states, such as a sleep state, a suspend state, or a shutdown state, in which the device overall uses minimal or no power.

Figure 4:
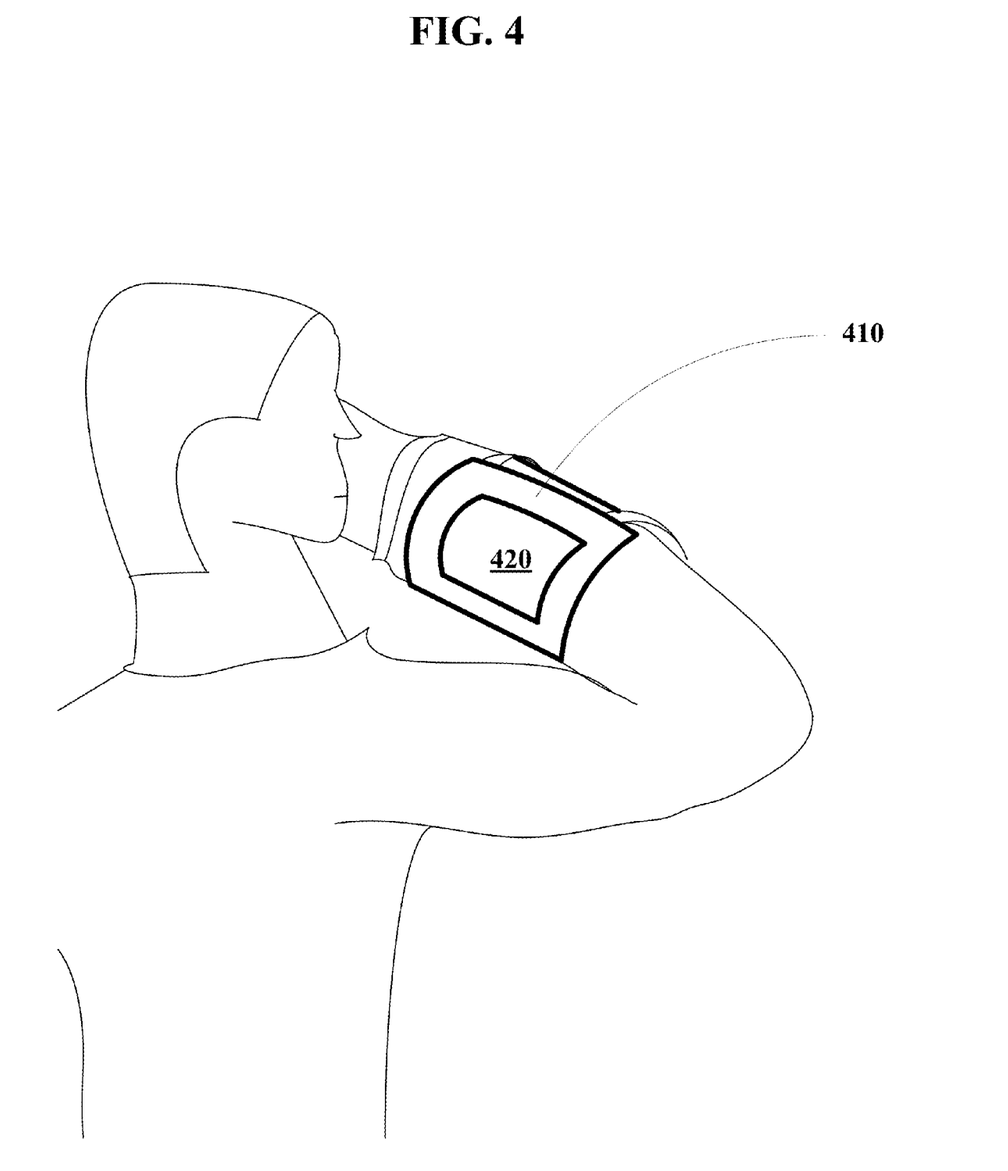
FIG. 4 shows an example of a wearable device according to an embodiment of the invention being worn by a user.

As another example, the sensor may include an orientation sensor. The device may be operated in a first mode when the orientation sensor indicates that the device is disposed vertically, and in a second mode when it is disposed horizontally. Thus, if a user is wearing the device on his arm, the device may operate in the first mode when the user's arm is held at his side, and in a second mode when the user raises his arm to view or access the device. FIG. 4 shows an example of such a device being viewed by a user. When positioned as shown, the device 410 may operate the OLED 420 in one mode, in which the OLED may emit at least a portion of light emitted by the OLED at a higher brightness than when the OLED is operated in a second mode. The second mode may be used, for example, when the device 310 is positioned vertically, such as when the user's arm is not raised as shown in FIG. 4.

As another example, the device may include a motion detector such as an accelerometer, and may operate the OLED in the higher-brightness mode in response to a detected motion. In this configuration, the device may begin operating the OLED in the second mode in response to a detected motion of the device, such as a user moving his arm into the position shown in FIG. 4.

As previously described, a device as disclosed herein may operate in two modes by adjusting the relative brightness of various colors emitted by an OLED display in the device. For example, the relative brightness of green light emitted by the OLED may be higher in one mode than in another. Similarly, the relative brightness of red and/or blue light emitted by the OLED may be lower in one mode than in another. In some configurations, instead of increasing the relative brightness of portion of the visible spectrum for a "higher-brightness" mode, the relative brightness of a different portion of the spectrum may be reduced. In this case the second mode may require the same or comparable power to the first, but may still provide a higher contrast than in the first mode.

Alternatively or in addition to the specific examples of sensors previously described, devices as disclosed herein may incorporate one or more of a variety of sensors. Examples of such sensors include light, motion, temperature, humidity, and any other available environmental sensors. As another example, various sensors may be included to monitor or detect health conditions of a user of the device, such as heart rate, glucose level, body temperature, and the like. Other examples of sensors may include specialty sensors, such as to detect toxic, biological, radioactive, or similar environmental conditions.

In an embodiment, the OLED may be a curved and/or flexible OLED, for example to match a curvature selected to make the device easier to wear by a user. As a specific example, the OLED may have a radius of curvature of not more than about 20-100 cm. The device may have a similar curvature, or may have a slightly different curvature depending upon the arrangement of other layers, components, and the like within the device. For example, the device may have an average curvature of about 20-100 cm, with each surface of the device having a radius of curvature of not more than about 18-22 cm.

As previously disclosed, various embodiments of the present invention may be partially or entirely ruggedized, to any suitable ruggedization specification. One feature of ruggedization often is the ability of a device to be immersed in water to a particular depth, such as 1 m or more. Embodiments of the present invention may include an OLED display encapsulated between two ruggedized surfaces, one of which may have a transparent cover region to allow the display to be viewed. The transparent cover window over the display may be sealed to the ruggedized case.

One technique to allow an OLED to survive immersion in water to a depth of greater than 1 m is the use of thin film encapsulation. Typically, a barrier layer with a WVTR of $10^{-6}$ $g/m^2/day$ is desirable to encapsulate an OLED. Additional encapsulation may be used in addition to a thin film to achieve ruggedization sufficient for water immersion. However, in some configurations a thin film encapsulation may be sufficient to protect the OLED from water.

This level of performance is sufficient for immersion if the immersion time is relatively short, for example, less than 1% of the expected device lifetime. When the OLED is immersed in water, the water concentration at the barrier surface becomes much higher, which will accelerate the diffusion of water, though the extra pressure under water contributes little to the concentration since liquid water doesn't compress easily with pressure. If the water immersion is relatively long, such as more than 10% of the expected device lifetime, a better barrier may be desirable, such as a barrier having a WVTR in the range of $10^{-7}$ $g/m^2/day$. This may be realized by using thicker barrier or a better barrier material. Alternatively or in addition, the surface of the barrier may be treated to have hydrophobic properties and thus reduce the concentration of water at the surface of the barrier layer. More generally, devices including OLEDs as disclosed herein may be ruggedized using other techniques known for OLEDs, LCDs, and similar devices.

OLED displays may be preferable for use in embodiments of the invention relative to conventional displays such as LCD displays, because the display can be curved to minimize overall device thickness. This may be especially important as the display sizes increases. Displays used in devices as disclosed herein may be up to 4.3 inches (viewable diagonal). In some embodiments, displays up to 5-6 inches may be incorporated into wearable, ruggedized devices, such as for wearing on the wrist, forearm, or thigh of a user. Conventional LCD displays typically are more difficult to curve or to incorporate in a curved device, due to the need for a backlight.

The use of OLED displays may allow for various physical form factors. For example, wearable ruggedized devices as disclosed herein may weigh not more than about 140 g, more preferably not more than about 95 g. Devices as disclosed herein also may be relatively thin; for example, devices may have a maximum thickness of not more than about 15 mm, or more preferably not more than about 8 mm.

Other components may be incorporated with the devices disclosed herein. For example, a circular or other polarizer may be included as part of the device. For example, a circular polarizer may be laminated to a protective plastic lid over the OLED display. Other electronic components also may be included, such as one or more cameras which may be front-facing (i.e., toward a user), or otherwise disposed so as to be usable by a wearer of the device.

Any suitable power source may be used with devices disclosed herein, including conventional batteries and power cells, flexible batteries, or an external source. External batteries may provide occasional charging and/or continuous power through any suitable connection, including USB and similar general-purpose connections, or a special-purpose connection.

Devices as disclosed herein may include a communication module, such as to provide wired and/or wireless connectivity to other devices and networks. In some cases, for security reasons it may be preferred to use wired connectivity exclusively or in part, such as to an encrypted radio being worn by the user. Such connections may be standard, general-purpose connections such as RS-232, RS-170 or USB connections, or special-purpose connections. In some configurations, various wireless communication channels for short, medium or long range communications may be used, such as wifi, Bluetooth®, IEE 802.11, IEEE 802.11 WLAN, IEEE 802.15 WPAN, IEEE 802.16 WMAN systems' architecture, and/or conventional 3G/4G LTE, CDMA/GSM, and other cellular-type network architectures.

In some configurations it may be desirable for a device as disclosed herein to include a wearable unit that is as light as possible. In such a configuration, it may be preferred to use external power, communication modules, and/or other modules. The wearable device may then send and receive wired or wireless signals to another component carried by the user, such as in another wearable device or form factor such as a backpack.

Wearable devices as disclosed herein may include one or more touch-sensitive surfaces, which may be integrated with an OLED display to provide a touch-sensitive display. Suitable touch-sensitive configurations include surface capacitive, projective capacitive, surface acoustic wave, infrared, resistive, acoustic pulse recognition, dispersive signal, and force sensing technologies, as will be readily understood by one of skill in the art. Where such components use additional sensors, such as to measure current, capacitance, timing, light, voltage, or mechanical forces, the sensors may be incorporated into or included separately from the other sensors disclosed herein.

Wearable devices as disclosed herein may include various components and features to connecting or wearing the device. For example, a wearable device may be attached to clothing with Velcro or other straps, such as to secure it around a wrist or leg of a user. Alternatively or in addition, a wearable device may be connected to or embedded in a garment, for example, to include as part of a uniform.

As previously disclosed, devices as described herein may be ruggedized according to one or more ruggedization standards or practices. Specific ruggedization techniques are generally known to those of skill in the art, such as with respect to LCD displays, and may be applied to OLED displays as described herein.

Experimental

Figure 5:
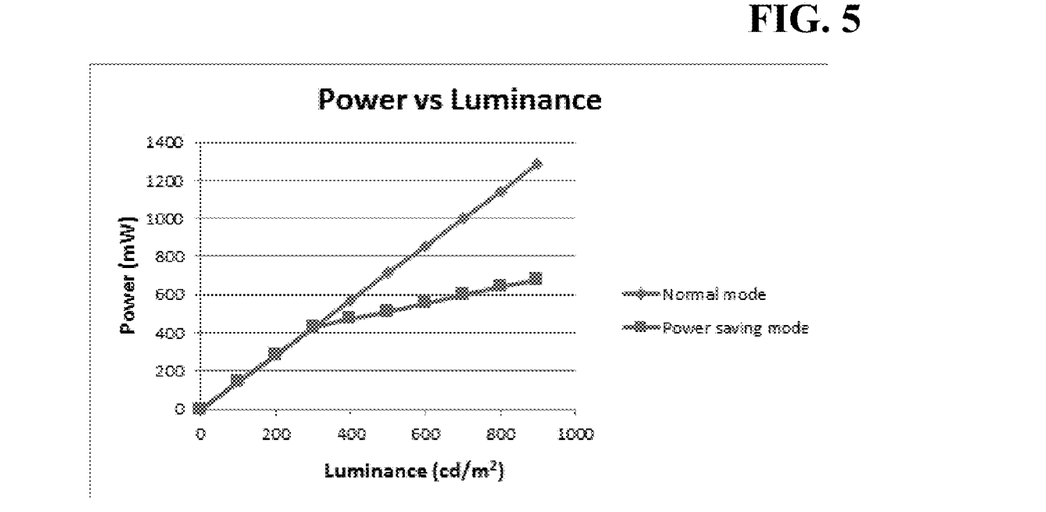
FIG. 5 shows a simulation of power used as a function of luminance for a device according to an embodiment of the invention as disclosed herein.

FIG. 5 shows a simulation of power used as a function of luminance for a device according to an embodiment of the invention as disclosed herein. The following assumptions were used:

| | | |
|---|---|---|
| Green | 100 | cd/A |
| Red | 35 | cd/A |
| Blue | 5.5 | cd/A |
| Pixel capacitance | 2.20E–08 | F/cm2 |
| OLED Voltage | 3.58 | V |
| TFT Voltage | 3.42 | V |
| Polarizer Efficiency | 44% | % |
| Green component | 62% | % |
| Red component | 27% | % |
| Blue component | 11% | % |
| % pixel on | 60% | % |
| Device Width | 8.85 | cm |
| Device Height | 4.98 | cm |

In the normal mode the display was operated at full color. In the power saving mode for luminances above 300 nits, the additional brightness above 300 nits was provided entirely by the green pixels. As shown in FIG. 5, when a lower-brightness power saving mode as disclosed herein is incorporated into operation of a device, a significant reduction in operating power may be achieved.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A computing device comprising:
an organic light emitting device (OLED) curved to a radius of curvature of not more than 100 cm; and
a display controller configured to operate the OLED in a first mode and in a second mode,
wherein the OLED includes addressable pixels comprising a first color sub-pixels and a second color sub-pixels,
wherein the display controller selectively changes a brightness of the first color sub-pixels relative to the second color sub-pixels to render a same image when the OLED switches from the first mode to the second mode, and
wherein the computing device is wearable.

2. The device of claim 1, further comprising an ambient light sensor configured to detect a brightness level of ambient light; wherein the display controller is configured to operate the OLED in the first mode when the brightness level of ambient light is below a first threshold, and in the second mode when the brightness level of ambient light is above a first threshold.

3. The device of claim 1, wherein the device is ruggedized.

4. The device of claim 1, further comprising a sensor, wherein the display controller is configured to operate the OLED in one of the first mode and the second mode based upon a measurement made by the sensor.

5. The device of claim 4, wherein the sensor comprises at least one selected from the group consisting of: an ambient light sensor, a motion sensor, and an orientation sensor.

6. The device of claim 5, wherein the sensor comprises an orientation sensor configured to detect a physical orientation of the device, and the controller is configured to operate the OLED in the first mode when the device is in a vertical orientation, and in the second mode when the device is in a horizontal orientation.

7. The device of claim 5, wherein the sensor comprises a motion detector, and the controller is configured to operate the OLED in the second mode responsive to a motion detected by the motion detector.

8. The device of claim 1, wherein the device is operable while immersed in water at a depth of at least 1 m.

9. The device of claim 1, wherein the device is operable at a luminance value of at least 700 cd/m$^2$ without exceeding an operating temperature increase of 26 C.

10. The device of claim 1, further comprising a ruggedization layer disposed over the OLED.

11. The device of claim 10, further comprising a thin film encapsulation layer disposed between the OLED and the ruggedization layer, wherein the thin film encapsulation layer is a single-layer barrier.

12. The device of claim 1, further comprising a circular polarizer disposed over the OLED.

13. The device of claim 1, further comprising a plurality of sensors, each sensor configured to measure at least one attribute selected from the group consisting of: ambient brightness, ambient lighting conditions, motion, temperature, humidity, a presence of a toxic agent, and a health condition of a user of the device.

14. The device of claim 1, further comprising a wireless communication module.

15. The device of claim 1, further comprising a camera.

16. A wearable computing device comprising:
an organic light emitting device (OLED) curved to a radius of curvature not more than 100 cm;
a ruggedization layer curved to a radius of curvature of not more than 100 cm; and
a display controller configured to selectively change a color balance of the OLED operated in a first mode relative to the color balance of the OLED operated in a second mode,
wherein an image rendered is the same in the first mode and the second mode, and
wherein the device is operable while immersed in water at a depth of at least 1 m.

17. The device of claim 16, wherein the device is operable at a luminance value of at least 700 cd/m$^2$ without exceeding an operating temperature increase of 26 C.

18. The device of claim 16, further comprising a thin film encapsulation layer disposed between the OLED and the ruggedization layer, wherein the thin film encapsulation layer is a single layer barrier.

19. The device of claim 16, further comprising a circular polarizer disposed over the OLED.

* * * * *